United States Patent
Bareiss et al.

(10) Patent No.: US 9,175,384 B2
(45) Date of Patent: Nov. 3, 2015

(54) COATED BODY AND A PROCESS FOR COATING A BODY

(75) Inventors: Christian Bareiss, Forchheim (DE); Werner Koelker, Herzogenrath (DE); Oliver Lemmer, Aachen (DE)

(73) Assignee: CemeCon AG, Würselen (DE)

( * ) Notice: Subject to any disclaimer, the term of this patent is extended or adjusted under 35 U.S.C. 154(b) by 8 days.

(21) Appl. No.: 13/695,231

(22) PCT Filed: May 2, 2011

(86) PCT No.: PCT/EP2011/056968
§ 371 (c)(1),
(2), (4) Date: Feb. 19, 2013

(87) PCT Pub. No.: WO2011/135100
PCT Pub. Date: Nov. 3, 2011

(65) Prior Publication Data
US 2013/0164557 A1    Jun. 27, 2013

(30) Foreign Application Priority Data
Apr. 30, 2010 (DE) .......................... 10 2010 028 455

(51) Int. Cl.
*C23C 16/00* (2006.01)
*C23C 16/02* (2006.01)
(Continued)

(52) U.S. Cl.
CPC .............. *C23C 16/0281* (2013.01); *B24D 3/00* (2013.01); *C23C 16/271* (2013.01); *Y10T 428/12625* (2015.01); *Y10T 428/24355* (2015.01); *Y10T 428/264* (2015.01); *Y10T 428/31678* (2015.04)

(58) Field of Classification Search
CPC ........ B23B 27/14; B23B 27/20; B23B 51/00; B23C 5/16; C23C 14/14; C23C 16/02; C23C 16/27
USPC ............. 427/249, 577, 249.1, 0.8, 0.14, 0.17, 427/18; 428/408, 457, 469
See application file for complete search history.

(56) References Cited

U.S. PATENT DOCUMENTS 4,734,339 A    3/1988  Schachner et al.
5,028,451 A *  7/1991  Ito et al. ...................... 427/577
(Continued)

FOREIGN PATENT DOCUMENTS

CN    101487121 A    7/2009
DE    68904314 T2    5/1993
(Continued)

OTHER PUBLICATIONS

Xiao et al "The failure mechanism of chromium as the interlayer to enhance the adhesion of nanocrystalline diamond coatings on cemented carbide" Diamond & Related Material 19 (2009) p. 1114-1117.*
(Continued)

*Primary Examiner* — Archene Turner
(74) *Attorney, Agent, or Firm* — Christensen O'Connor Johnson Kindness PLLC

(57) ABSTRACT

The invention relates to a body with a substrate (1), an intermediate layer (2) applied on top thereof and a CVD diamond layer (3) applied to the intermediate layer. In order to propose a body coated with CVD diamond and a production process, in which the body has an increased load-bearing capacity under various mechanical loads, provision is made for the intermediate layer to be predominantly metallic, wherein the metal fraction of the intermediate layer consists predominantly of tungsten and/or chromium, and for the intermediate layer to have a roughness defined by an Rz value of 0.5 μm-3.0 μm.

28 Claims, 4 Drawing Sheets

(51) Int. Cl.
*B24D 3/00* (2006.01)
*C23C 16/27* (2006.01)

(56) References Cited

U.S. PATENT DOCUMENTS

| | | | |
|---|---|---|---|
| 5,713,133 A * | 2/1998 | Bhat et al. | 30/350 |
| 6,096,377 A | 8/2000 | Karner et al. | |
| 6,660,329 B2 * | 12/2003 | Liu et al. | 427/249.13 |
| 7,195,817 B2 * | 3/2007 | Lev et al. | 428/336 |
| 7,261,753 B2 | 8/2007 | Yamamoto et al. | |
| 8,574,715 B2 * | 11/2013 | Ito et al. | 428/408 |
| 2002/0071949 A1 | 6/2002 | Liu et al. | |
| 2006/0147631 A1 | 7/2006 | Lev et al. | |
| 2010/0104860 A1 | 4/2010 | Chou et al. | |

FOREIGN PATENT DOCUMENTS

| | | |
|---|---|---|
| DE | 19522372 A1 | 11/1996 |
| DE | 199 14 585 C1 | 9/2000 |
| EP | 0503822 A2 | 9/1992 |
| EP | 0589641 A2 | 3/1994 |
| EP | 1291450 A2 | 3/2003 |
| JP | 8232067 A | 9/1996 |
| JP | 11193479 A | 7/1999 |
| WO | 98/40532 A1 | 9/1998 |
| WO | WO03020997 A1 | 3/2003 |
| WO | 2004/083484 A1 | 9/2004 |

OTHER PUBLICATIONS

Naguib et al "Enhanced nucleation, smotthness and conformality of ultrananocrystalline diamond (UNCD) ultrathin films via tungsten interlayers" Chemical Physics Latters 430 (2006) p. 345-350.*
Ralchenko, V.G. et al., "Diamond deposition on steel with CVD tungsten intermediate layer", Diamond and Related Materials, Elsevier Science Publishers, Amsterdam, NL, Bd 4, Nr. 5-6, May 1, 1995, Seiten 754-758, XP004066823, ISSN: 0925-9635,DOI: DOI: 10.1016/0925-9635(94)05299-9 Zusammenfassung (Absatze [0002], [0003], Absatze [0001], [03.3] Abbildung 1.
Hermann, Jehn, "Characterization of Thin Layers", DIN technical report 39, ISSN 0179-275X, p. 21 ff, 1993.

* cited by examiner

COATED BODY AND A PROCESS FOR COATING A BODY

The invention relates to a coated body and a process for coating a body.

It is known to provide bodies or parts of bodies with a surface coating for improving the properties. In particular for tools and components that undergo wear, it is known to provide functional surfaces with a diamond layer. A known process is hereby the application of a diamond layer by means of a CVD (Chemical Vapor Deposition) process.

Coated bodies comprise a substrate material and a diamond layer applied on top. In particular, in connection with the present invention, substrate materials are hard metals and cermets, i.e. sinter materials made of hard material particles and binder material, in particular with WC grains in a Co-containing matrix. But the invention also relates to all other substrate materials, such as steels, titanium materials, ceramics, etc.

Diamond-coated hard metal or respectively cermet tools are used among other things in chipping. In particular, the high hardness of the diamond thereby positively impacts the wear protection of the tool. Another important advantage is the low adhesion tendency of the material of a counter body, i.e. that, in the case of tools with a diamond layer, the adhesion of the chipped materials in the form of built-up edges is prevented.

However, the diamond coating cannot be applied to many substrate materials or only with slight adherence. This includes in particular materials that contain Fe, Co and Ni. Different pretreatment methods are known in order to obtain nonetheless good adherence of the diamond coating on the substrate.

In the prior art, e.g. U.S. Pat. No. 6,096,377 or DE 19522372, methods have been described in which selectively destructive substrate components, in particular cobalt, are removed from hard metal substrates. Chemical etching is thereby most used. It is to be determined for these known methods that the removal of substrate components weakens the substrate composite precisely in the highly loaded surface area. Thus, a later failure occurred precisely in the interface or in the near-surface, etched substrate.

Other publications, such as WO 03/020997 and EP 1291450 A2, describe thermal pretreatments, in which destructive substrate phases are changed or diminished through diffusion or sinter processes. These processes also lead to an embrittlement in the critical near-surface area of the substrate. Not only is the coating adhesion thereby negatively affected but also the fracture toughness of the entire body. The reduction of the fracture toughness also depends on the ratio of embrittled to intact substrate material and becomes all the more noticeable the smaller the cross-section of the body. This embrittlement is especially disadvantageous for small bodies and thin rotating tools like micro tools, e.g. board borers, since here the ratio is comparatively unfavorable. In the case of these tools, tool failure even without embrittlement through a pretreatment is already an important failure factor. In these cases, hard metals with a high cobalt content and small grain sizes are used in particular in order to increase the toughness of the tool. Precisely here are the pretreatment methods of the state of the art particularly destructive, since e.g. more cobalt must be removed and the cohesion in the case of small carbide grains is rather lost during etching.

In order to avoid embrittlement, it was further suggested to apply intermediate layers, which have both a good adhesion to the diamond as well as to the substrate. The main idea in all cases is to prevent the direct contact of the carbon with the substrate components destructive for the diamond formation. A plurality of materials and embodiments were suggested and listed, but which do not permit identification of a standard trend and of which no embodiment has proven itself in the market, e.g. DE 68904314 T2, U.S. Pat. No. 4,734,339. The reason could be the still lack of adhesion of the intermediate layer on the substrate or respectively the diamond layer on the intermediate layer when loaded.

Thus, the object of the invention is to suggest a body coated with CVD diamond and a method for producing such a body, wherein the body has an increased load-bearing capacity under various mechanical loads.

This object is solved by a body according to claim 1 and alternatively according to claim 34 as well by a method according to claim 27. Dependent claims relate to advantageous embodiments of the invention.

According to the invention, a body between a substrate and a CVD diamond layer has an intermediate layer with special properties.

According to the invention, the intermediate layer is predominantly metallic. A predominantly metallic intermediate layer is hereby understood in that, in the predominant volume share of the intermediate layer, the atoms are metallically bound. Predominantly means hereby in more than 50% of the volume, preferably in more than 70% of the volume, more preferably in more than 90% of the volume.

Furthermore, according to the invention, the metal portion of the intermediate layer thereby consists predominantly, i.e. by more than 50 at.-%, of the elements W and/or Cr. More preferably, the metal portion in the intermediate layer consists by at least 70 at.-% of tungsten and chromium, most preferably by 90 at.-%.

"Predominantly" thereby refers to the atom portions. The metal portion of a metallic element is understood as the portion of the atoms of this element in relationship to all metal atoms in the intermediate layer.

Particularly good results were achieved with an intermediate layer, in which the metal portion—except for unavoidable impurities—consists completely of tungsten and/or chromium.

The body does not have to be coated thereby over the entire surface with the intermediate, the adhesion and/or the CVD diamond layer, but rather only at positions where the wear impairs the lifespan of the body compared to a conventional body. The claimed characteristics also do not need to be met at each position.

In a complex series of tests, which eventually led to the invention, it was determined that such predominantly metallic intermediate layers with the elements chromium (Cr) and tungsten (W) showed by far the best results. The rest included e.g. carbon and other carbide-forming metals.

It is thereby insignificant whether or not tungsten and/or chromium are already contained as elements in the substrate.

According to the invention, the intermediate layer also has a defined roughness. The Rz value is hereby considered the measure for the roughness.

In the case of the body according to claim 1, according to the invention, it lies between a minimum value of 0.5 μm and a maximum value of 3.0 μm. The Rz value is preferably at least 1.0 μm, more preferably at least 1.5 μm. The upper limit is preferably 2.5 μm, and more preferably 2.0 μm.

In the case of the body according to claim 34, according to the invention, the roughness of the intermediate layer (2) is greater than the roughness of the substrate (1) and the roughness of the diamond layer.

Bodies with a substrate and CVD diamond layer, in which an intermediate layer according to the invention is provided, show considerable advantages with respect to conventional diamond-coated bodies. The disadvantages of conventional pretreatment methods, in particular a weakening or embrittlement of the substrate, are avoided. A particularly good adhesion simultaneously results from the roughness of the intermediate layer.

It is provided according to a further embodiment of the invention that the intermediate layer is at least 0.5 µm thick. More preferred is a layer thickness of at least 1.0 µm, most preferably at least 1.5 µm. According to a further embodiment of the invention, the upper limit of the thickness of the intermediate layer is 10 µm. A thickness of no more than 5 µm is preferred, more preferably not more than 3 µm.

In the case of the method according to the invention, an intermediate layer is first applied at least predominantly metallically, preferably purely metallically, on a substrate. This takes place in a PVD process, preferably by means of magnetron sputtering. After his, a diamond layer is applied on the thusly formed intermediate layer by means of a CVD process. This can lead to a partial carburation of the metals during the CVD diamond process. The experiments have shown that this is advantageous for the adhesion of the diamond layer. This carburation can take place in a separate upstream process or process step separately or in situ. Since the CVD diamond coating takes place under carburating conditions, the carburation can also take place during the diamond coating or in the phase of the coating, in which the diamond layer has not yet completely finished. Once a carbide layer has formed, the further carburation takes place considerably slower. Furthermore, one embodiment of the invention has shown that the carburation can preferably take place via grain-boundary diffusion in the metal layer, whereby a partial composite structure is formed from a carburation network with embedded metal crystallites. Advantageously, the substrate temperature can be selected in the range of 600 to 1000° C., preferably in the range from 700 to 900° C., more preferably in the range from 750 to 850° C. It has been shown that it is advantageous that a part of the intermediate layer remains metallic, preferably that the predominant part of the intermediate layer remains metallic. The metallic portion on average is thereby closer to the substrate than the carburated portion.

In the case of an intermediate layer with chromium, the carbidic bonds are preferably $Cr_7C_3$ and/or $Cr_3C_2$; in the case of intermediate layers with tungsten $W_2C$ and/or WC.

In the case of materials with hard material particles in a binder matrix, for example in the case of hard metals, an adhesion layer, which consists of the intermediate layer elements but which is alloyed with the metal of the binder matrix, can be applied between the substrate and the intermediate layer.

The advantages of the invention are brought to bear in particular in the case of higher cobalt contents of 10 wt.-% and above, as well as in the case of small or medium carbide grain sizes less than or equal to 1 µm, preferably of less than or equal to 0.7 µm, i.e. in the case of fine grain, ultra-fine grain and nano-grain types. The described disadvantages of the previously known methods are hereby avoided in particular in the case of small bodies and thin rotary tools, such as micro tools, e.g. board borers.

Embodiments of the invention are described in greater detail below based on drawings. In the drawings.

Figure 1:
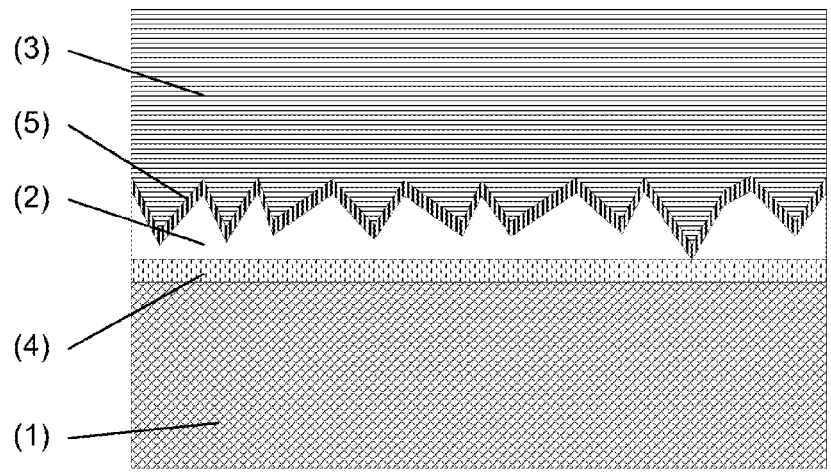
FIG. 1 shows a diagramed cross-section through a first embodiment of a body with substrate and layers applied to it.

FIG. 1 shows a diagramed cross-section through a body in accordance with a first embodiment with a substrate 1, an intermediate layer 2, a diamond layer 3 and an adhesion layer 4. The adhesion layer 4 is optional and can be omitted in alternative embodiments. The intermediate layer can also optionally have a carburated portion. The drawing only shows the principle and is not true to scale; the length to width ratios or the ratios of the different layer thicknesses are also not true to scale.

Figure 2:
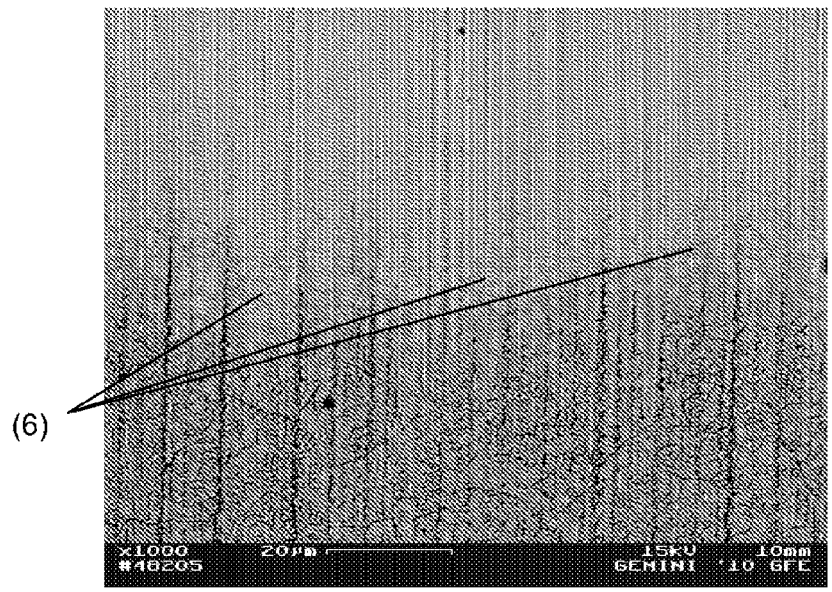
FIG. 2 shows as a microscopic image, a calotte microsection through an intermediate layer.

FIG. 2 shows the edge of a calotte microsection through a partially carburated intermediate layer. For better visibility, prior roughening was not performed. The dark part shows the carburated surface, which is partially laced with cracks. The light part is the polished section of the metallic portion of the intermediate layer. A three-dimensional, net-like composite structure 6 is visible in the transition area.

Figure 3:
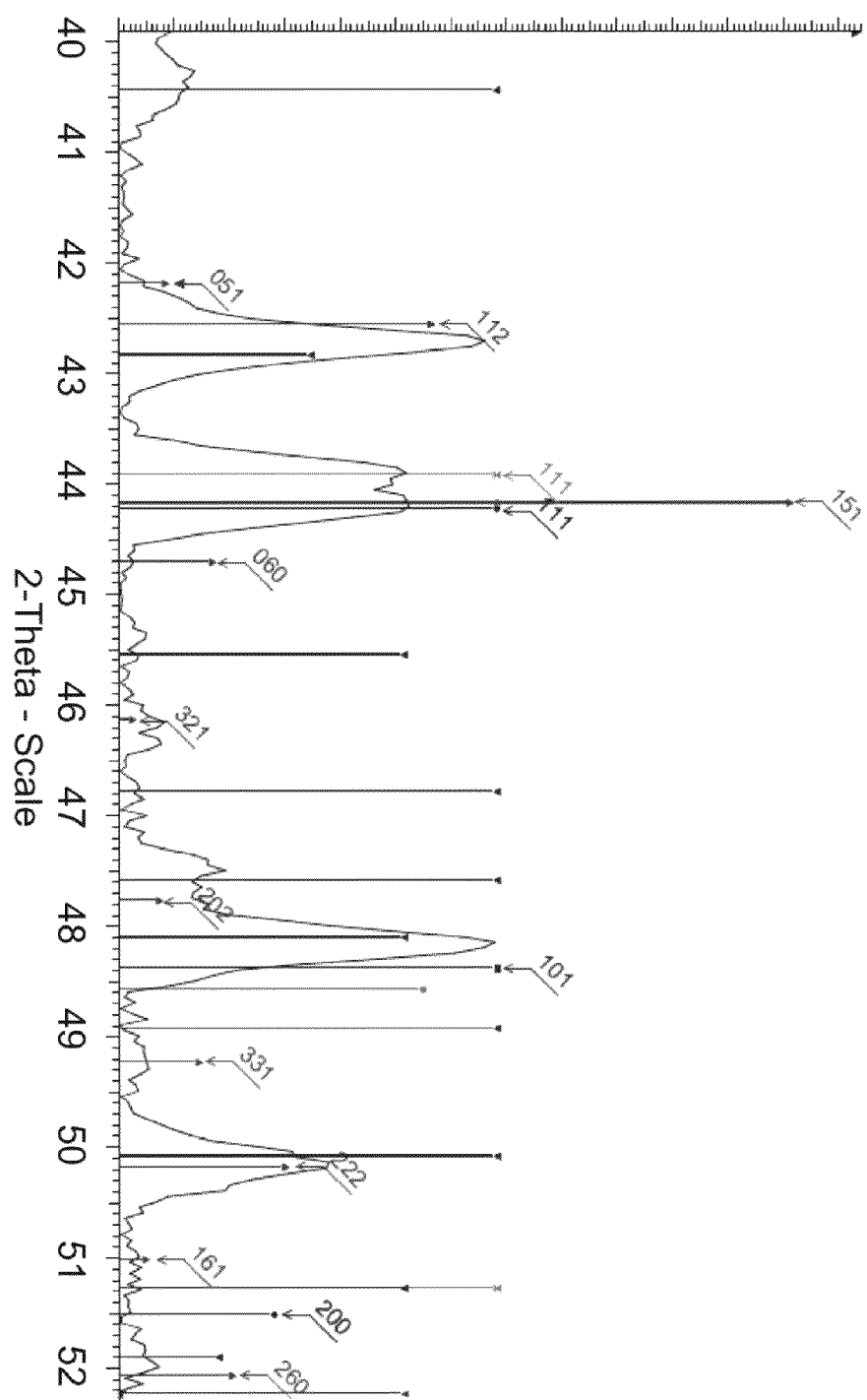
FIG. 3 shows the XRD spectrum of an intermediate layer.

FIG. 3 shows the XRD spectrum of a partially carburated Cr intermediate layer of an embodiment of the invention with evidence of the carbidic bonds $Cr_7C_3$ and $Cr_3C_2$.

Figure 4:
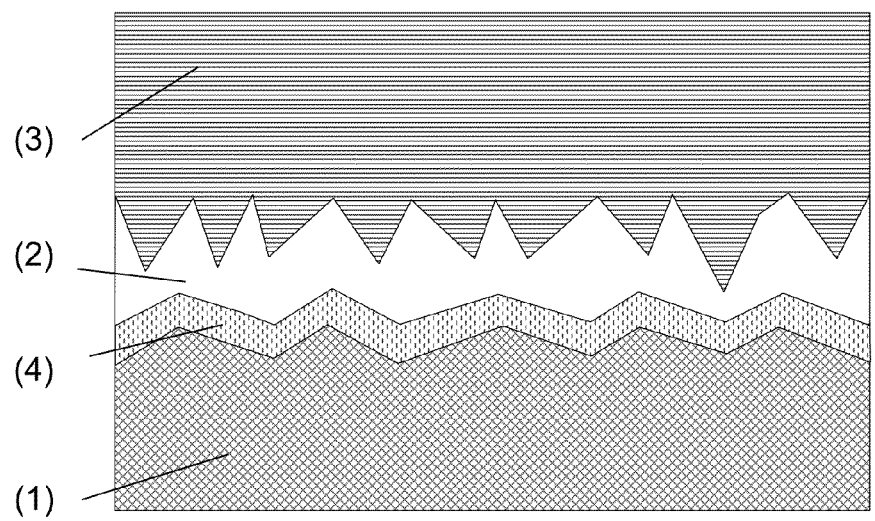
FIG. 4 shows a diagramed cross-section through a second embodiment of a body with a substrate and layers applied to it and FIG. 5 shows a calotte microsection of a coated body.

FIG. 4 shows in comparison with FIG. 2 an analogous layer system with a rough substrate.

It is understood that the named properties do not need to be present over the entire body, but rather above all at particularly highly loaded positions, which would lead to premature failure of the body. In the case of cutting tools for chipping, this would be the area of the blades, in particular the blades or blade areas, which chip the most material when in use.

In the case of embodiments of the invention, the intermediate layer has a certain roughness, which is measured as Rz value. This roughness mainly contributes to the improvement of the adhesion, since a larger surface and a mechanical clamping results between the intermediate layer and the diamond layer. The prevention or respectively the reduction of cracks in the carbide portion in the intermediate layer is suspected as a further reason for an improved adhesion. In the case of a compact, smooth intermediate layer, cracks form during the carburation, which can spread to the entire layer system when loaded and thus lead to the dissolution of the diamond layer. The cracks are also visible in FIG. 2.

Different thicknesses of the intermediate layer were examined in usage and wear tests. An improvement in the adhesion was already observed with low thicknesses of this intermediate layer of just 0.5 µm. Better results appear as of a thickness of 1.0 µm, especially good as of 1.5 µm. The thickness of the intermediate layer should thereby not be too large, in particular not more than 10 µm, preferably not more than 5 µm, more preferably not more than 3 µm.

The roughness of the intermediate layer is formed by recesses and raises. Thus, the thickness of the intermediate layer is understood as the distance between the substrate and the average height of the raises. They can be determined among other things through examinations of a cross-section polish or break in the SEM at e.g. 5000 times magnification or estimated by means of SEM images. The roughness parameters Ra, Rmax, Rz are defined for surfaces and are generally measured with scan processes. The determination takes place according to DIN EN ISO 4287 in that the long-wave portions, which are attributed to the exterior shape of the body, are not observed. For the coated bodies observed here, a determination of the values on the cross-section, e.g. with the help of SEM images, can be performed analogously. The average roughness depth Rz in the grinding pattern should hereby be taken analogously from the horizontal distance between "peaks" and "valleys." The measured sections must be selected to be correspondingly short.

It has been shown in tests that the best results are achieved when the roughness Rz of the intermediate layer makes up a considerable portion of the layer thickness and it makes up at least 15% of the layer thickness, more preferably at least 30%, most preferably at least 50%.

Any coating process is suitable for applying the intermediate layer. CVD processes have the advantage that the intermediate layer and the diamond can be applied with the same process under certain conditions also in situ. Very good results are achieved with PVD processes, in particular with magnetron sputtering. An advantage is that the layers are shot with ions during the coating through the conventionally applied substrate bias. This compresses the layers and also creates favorable compression strength in the layer.

Further improvements are seen when the intermediate layers are created by means of "High Power Pulse Magnetron Sputtering" (HPPMS). This process goes back to an invention by V. Kouznetsov (WO 98/040532). Here, a very high share of ions of the target is created by short but very high-energy impulses on the target with power densities above 800 W/cm$^2$. With this technique, the pulse times make up less than 10% of the cycle time so that the power introduced on average does not overload the magnetrons.

The layers thus become even stronger and better follow the contours of the substrate surface. Furthermore, the substrate can be pretreated with this method in that the energy of the ions is increased through increasing the substrate pretension (bias). Thus, there is no accumulation of layers but rather an intensive cleaning of the surface. In the case of a further increase in the bias of e.g. 800 V or more, ions can even be implanted into the substrate, which increases the adhesion of the intermediate layer subsequently applied with normal bias.

After the application of the intermediate layer, the substrates are generally removed from the system and undergo further procedures. This includes the roughening of the intermediate layer. In principle, it is insignificant how this roughness is created. It can e.g. also be determined through the roughness of the substrate, in that a rough substrate is selected and the intermediate layer is applied in a form-fitting manner or the leveling effect by the intermediate layer is accordingly considered so that the desired roughness is achieved. However, a subsequent roughening of the intermediate layer is preferred.

It can be set in the desired range through different processes. This includes all methods generally known to a person skilled in the art, such as chemical or electrochemical etching, ultrasound with abrasive particles, sand blasting or shot blasting or respectively LASER roughening. As a general rule, the roughness must be increased by one of these procedures, in order to achieve the desired Rz value; but must also be reduced under certain circumstances. In the latter case, methods are e.g. shot blasting, mechanical or electrochemical polishing or respectively LASER smoothing.

For normal roughening, mechanical processes, in particular the beam process, are preferred according to the invention. Here, abrasive particles e.g. made of corundum or silicon carbide, are accelerated onto the surface until the desired roughness is achieved. The blasting processes comprise sand blasting but also wet blasting, shot blasting or dry ice blasting.

The abrasive substance is preferably carbidic particles, in particular SiC particles, which have a grain size of less than 100 µm, preferably less than 70 µm and more preferably less than 30 µm.

In many cases, the substrates already have a certain roughness. This roughness can transfer to the diamond layer 3, so that the intermediate layer 2 has the same roughness as the substrate or a roughness lying slightly below the roughness of the substrate. In principle, the roughness according to the invention can thus also be set via the roughness of the substrate. But, the roughness of the intermediate layer is preferably performed according to the aforementioned manner. The roughness of the intermediate layer is preferably also higher than the roughness of the substrate. Furthermore, it is preferred that the average distance between the roughness tips in the case of the intermediate layer is less than in the case of the substrate.

The roughness of the intermediate layer can also transfer in full or in part to the diamond layer. However, there is at least one coating process, which can create particularly smooth diamond layers and level the roughness of the substrate or respectively the roughness of the layer lying below the diamond layer. This is described in WO 2004/083484 of the applicant. This document is hereby included as reference in this document. Such a method should preferably be used for coating.

It is preferred specifically in the case of the preferred mechanical methods for roughening to apply purely metallic intermediate or respective adhesion layers. These are more ductile and there are fewer defects or respectively cracks than in the case of a ceramic layer or a hard material layer.

After setting the roughness, further procedures can be performed. These include e.g. a nucleation pretreatment (seeding) with abrasive and/or diamond particles, which can improve the density of nucleation sites and the adhesive strength of the CVD diamond coating. Here, treatments in ultrasound suspensions have proven to be the best, for example in an alcohol suspension with diamond powder with an average grain diameter of 0.25 µm. Furthermore, a carburation treatment can already be performed here, in which the surface of the intermediate layer is carburized. In principle, all processes known to the person skilled in the art are possible here.

Cleaning procedures between individual process steps may make sense to eliminate contaminations on the substrate surface before the next process step or to prevent the carryover of material between the individual devices.

The CVD diamond layer is applied with the known processes. The hot filament method is to be preferred in the case of tools for chipping. In contrast to other carbon layers such as DLC, the CVD diamond layer contains predominantly crystalline sp3-bound carbon. In a preferred embodiment, it contains nanocrystalline diamond and is also preferably multi-layered. Nanocrystalline layers are smoother and when used on a blade split a workpiece material to be cut more effectively and with low cutting forces. Layers made of several individual layers, which contain different crystallite sizes and/or different shares of carbon in the non-diamond configuration, have particular advantages, since cracks at the boundaries of the individual layers occurring during load are deflected and do not reach the critical substrate layer interface. The creation of micro- and nanocrystalline layers or respectively multilayers is described for example in DE 19914585 C1. A multi-layer diamond layer is preferably finished with a nanocrystalline layer. Furthermore, it preferably begins with a microcrystalline layer.

Nanocrystalline diamond consists predominantly of diamond crystals. They have diameters in the nanometer range. The average diameter of the diamond crystals preferably lies in the 10-100 nm range, more preferably in the 20-80 nm range. Nanocrystalline diamond thus differs from the group of DLC layers. They contain predominantly amorphous bonds of the carbon and in many cases also hydrogen.

The body is preferably a tool or part of a tool, preferably for chipping materials. Hard metal is preferred as the substrate material, in particular hard metal, which consists predominantly of WC and Co.

The thickness of the entire diamond layer can in principle be 0.5 to 50 µm, preferably 1 to 20 µm. Thicker layers have a greater wear volume. However, thicker layers are less economical due to the longer process times and increasing rounding of the cutting edges results. Furthermore, susceptibility of the layers to cracks is higher. Layer thicknesses of 6 to 15 µm are thus preferred in the case of cutting tools with a specific blade. Particularly good results were achieved with layer thicknesses of 8 to 10 µm. Here, the layer thickness in the area of the particularly loaded blade edges is meant in particular.

The invention has, as already mentioned, particular advantages in the case of tools with small diameters. This includes borers and millers for processing fiber-reinforced materials such as GRP and CFRP; but in particular also micro tools such as board borers or millers for processing boards (so-called routers). Here, the sensitivity to breaks is already thus increased and is further worsened through the conventional pretreatments for the CVD diamond coating. Rotary tools created with the preferred process with diameters less than 6 mm, preferably less than 3 mm, more preferably less than 1 mm, show in comparison particularly good service lives.

Further advantageous variants of the invention are described below.

In one variant, an adhesion layer, which contains shares of the binder metal of the hard metal, is located between the substrate and the intermediate layer in the case of substrates made of hard metal. This increases the ductility of the hard metal surface and facilitates the adhesion of the intermediate layer. Loads in the use and thermally induced tensions through the coating or in the use can thus be better tolerated. The adhesion layer is preferably thinner than the intermediate layer.

In one variant, the metal portion of the intermediate layer consists of Cr except for unavoidable impurities.

In a further variant, the adhesion layer consists of Cr and Co.

In a further variant, the intermediate layer consists predominantly of W in a section lying closer to the substrate and predominantly of Cr in a section lying further outside.

In the preferred method for producing the body, the substrate is cleaned with a conventional process and then an intermediate layer made of Cr, W or an alloy is preferably applied by means of a PVD process. The desired roughness of the layer is set later in that the layer is sand-blasted e.g. with hard material particles and then undergoes CVD diamond coating. A partial carburation of the intermediate layer surface preferably takes place before or during the diamond coating. Optionally, a nucleation pretreatment can be performed before the carburation and/or the diamond coating. Cleaning steps are preferably performed between each step.

The substrate can also undergo a blasting treatment before the PVD coating. Inhomogeneities, as they occur for example through sinter processes, are hereby equalized and/or the potentially existing abrasive skin is worn away. A better adhesive base is hereby created for the intermediate layer. The roughness can also hereby increase. A wet blasting process is preferably used for the prior blasting of the substrates.

In particular for hard metal substrates, an adhesion layer can be provided below the intermediate layer. This can occur with the same processes with which the intermediate layer can also be applied, or in that after the application of the intermediate layer in later treatment steps the process conditions are selected such that binder material is diffused into the intermediate layer. This diffusion can take place for example at the beginning or during the diamond coating, e.g. through an in situ annealing treatment in the diamond plant at 900° C. in hydrogen atmosphere.

Figure 5:
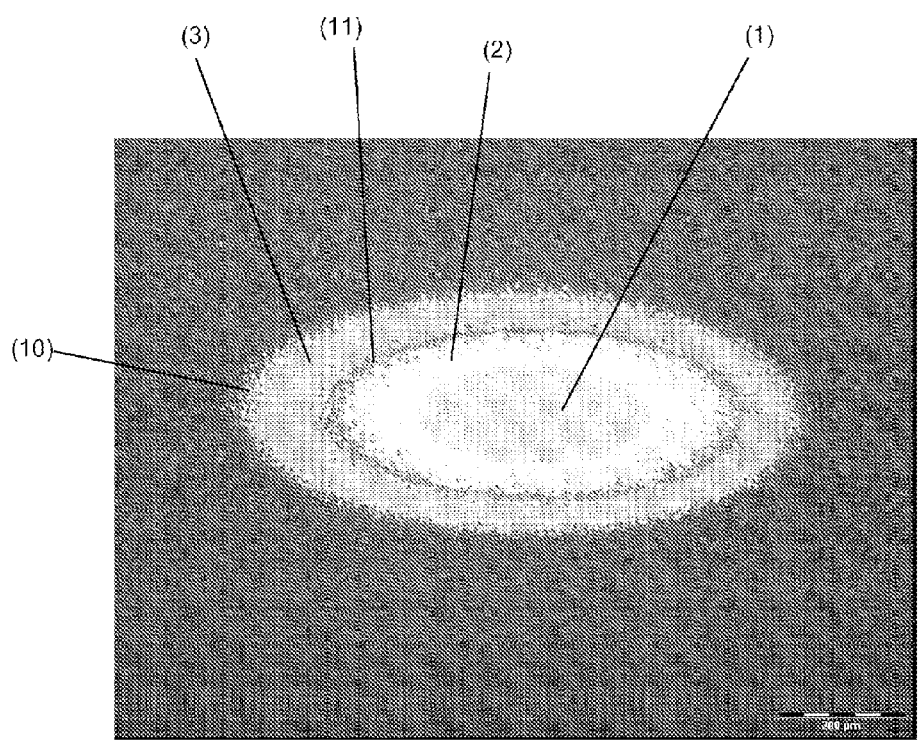

In addition to metallographic grinding, the layer thicknesses can also be determined by means of the calotte microsection, as shown in FIG. 5. This process is illustrated for example in DIN technical report 39, "Charakterisierung dinner Schichten" (Characterization of Thin Layers), (ISSN 0179-275X), page 21 ff. Since the zone can also be understood as the layer thickness with the roughness peaks and valleys and is shown in the calotte microsection as a pore rim, the roughness values, such as Rz or Rmax, can thus also be estimated.

FIG. 5 shows such a calotte microsection. An outer ring 10, the diamond layer 3, an inner ring 11 with pore rim, a chromium layer 2 as well as the hard metal substrate 1 can be seen.

A few detailed application examples are explained below.

EXAMPLE 1

A borer with a diameter of 4.5 mm made of a WC-Co fine-grain hard metal with an average grain size below 0.7 µm and a cobalt binder portion of 12 wt.-% is to be coated with a well-adhered diamond layer for the boring of CFRP. For this, the intermediate layer is first applied to the tool after a cleaning in order to eliminate potential oil residue. A metallic chromium layer, which is precipitated by means of an HPPMS (High Power Pulse Magnetron Sputtering) technique and covers the entire surface of the tool functional area after the process, is selected as a suitable layer. The thickness of the chromium layer is 2.1 µm. The Cr layer then undergoes a mechanical blasting process with hard material particles and a roughness of the Cr layer of Rz 1.7 µm is set. A nucleation pretreatment then takes place in an ultrasound diamond suspension. After further cleaning in the ultrasound, the diamond coating takes place in a hot filament system at 800° C. In the initial phase of the coating, a thin Cr-carbide intermediate layer forms, the formation of which is mainly complete when the diamond layer is finished. Overall, an 8.0-µm, multi-layer diamond layer is precipitated, in which microcrystalline and nanocrystalline coating layers alternate. Through the intermediate layer, the adhesion of the diamond layer and thus the service life compared to the same tools that, however, underwent a conventional etching pretreatment were increased considerably.

EXAMPLE 2

A ball nose mill with a functional diameter of 0.5 mm made of a fine-grain hard metal with 8 wt.-% binder portion is first coated by means of DC sputtering with a 2.2-µm-thick, metallic tungsten layer. The tungsten layer then undergoes an electrochemical etching process and a roughness of Rz=1.95 µm is thereby set. Further processing then takes place in a CVD system, wherein Co is first diffused into the W layer to a depth of approx. 0.2 µm through a preliminary heat treatment at 900° C. in the system in a hydrogen atmosphere on the substrate side. The precipitation of a 6-µm-thick, fine-crystalline diamond layer then takes place in turn in a hot filament process. The tool's sensitivity to breaks and service life are improved considerably compared to otherwise identical tools that, however, were pretreated according to the state of the art.

The invention claimed is:

1. A body with a substrate including a cobalt binder material, an intermediate layer, an adhesion layer located between the substrate and the intermediate layer, and a CVD diamond layer applied to the intermediate layer,
    wherein the intermediate layer is predominantly metallic,
    wherein the metal portion of the intermediate layer contains chromium and is predominantly made of tungsten and/or chromium, and
    wherein the intermediate layer contains, in an area located adjacent to the diamond layer, carbides of metallic elements, including at least $Cr_7C_3$ and/or $Cr_3C_2$,
    wherein the intermediate layer has a roughness, defined by an Rz value of 0.5 μm-3.0 μm, and
    wherein the adhesion layer contains metallic elements from the intermediate layer and cobalt.

2. The body according to claim 1, wherein the Rz value of the roughness of the intermediate layer is at least 1.0 μm, and wherein the Rz value of the roughness of the intermediate layer is less than or equal to 2.5 μm.

3. The body according to claim 2, wherein the Rz value of the roughness of the intermediate layer is at least 1.5 μm.

4. The body according to claim 2, wherein the Rz value of the roughness of the intermediate layer is less than or equal to 2.0 μm.

5. The body according to claim 1, wherein the thickness of the intermediate layer is at least 1.0 μm, but not more than 5.0 μm.

6. The body according to claim 5, wherein the thickness of the intermediate layer is at least 1.5 μm, but not more than 3.0 μm.

7. The body according to claim 1, wherein the metal portion in the intermediate layer consists of at least 70 at. % tungsten and chromium.

8. The body according to claim 7, wherein the metal portion in the intermediate layer consists of at least 90 at. % tungsten and chromium.

9. The body according to claim 7, wherein the metal portion in the intermediate layer consists completely of tungsten and chromium except for unavoidable impurities.

10. The body according to claim 1, wherein the roughness R2 of the intermediate layer is at least 15% of the layer thickness.

11. The body according to claim 10, wherein the roughness Rz of the intermediate layer is at least 30% of the layer thickness.

12. The body according to claim 10, wherein the roughness Rz of the intermediate layer is at least 50% of the layer thickness.

13. The body according to claim 1, wherein the metal portion in the intermediate layer (2) consists of chromium except for unavoidable impurities.

14. The body according to claim 1, wherein the area of the intermediate layer that contains carbides has a lesser volume than the area that contains no carbides.

15. The body according to claim 1, wherein:
    the carbides forming in the intermediate layer form at least partially a three-dimensional net-like composite structure; and
    the net-like composite structure is designed such that the carbide areas predominantly surround the metallic areas.

16. The body according to claim 1, wherein a metal portion in the adhesion layer consists of cobalt and chromium except for unavoidable impurities.

17. The body according to claim 1, wherein the intermediate layer and/or an adhesion layer is designed with multiple layers.

18. The body according to claim 1, wherein the intermediate layer in a zone directly adjacent to the diamond layer contains predominantly chromium as the metallic element and in a zone located closer to the substrate, predominantly tungsten.

19. The body according to claim 1, wherein the body is a rotary tool with a functional diameter of less than 6 mm.

20. The body according to claim 1, wherein the body is a rotary tool with a functional diameter of less than 3 mm.

21. The body according to claim 1, wherein the body is a rotary tool with a functional diameter of less than 1 mm.

22. A method for the production of a coated body, in which at least a predominantly metallic intermediate layer is applied to a substrate by means of PVD using a magnetron cathode, wherein during at least a part of the time while the intermediate layer is applied said magnetron cathode is operated according to a HPPMS process, wherein the intermediate layer consists predominantly of tungsten and/or chromium, wherein the intermediate layer is blasted with silicon carbide to create a roughness, and wherein a diamond layer is applied to the intermediate layer by means of CVD.

23. The method according to claim 22, in which the intermediate layer is applied purely metallically by means of PVD.

24. The method of claim 22, wherein the diamond layer is applied by means of the hot filament process and the substrate temperature, at least in the phase of the coating, in which the diamond layer is not yet finished, lies in the range of 600 to 1000° C.

25. The method of claim 24, wherein the substrate temperature, at least in the phase of the coating, in which the diamond layer is not yet finished, lies in the range of 700 to 900° C.

26. The method of claim 24, wherein the substrate temperature, at least in the phase of the coating, in which the diamond layer is not yet finished, lies in the range of 750 to 850° C.

27. The method of claim 22, further comprising applying an adhesion layer between the substrate and the intermediate layer.

28. The method of claim 27, wherein the adhesion layer comprises cobalt and elements of tungsten and/or chromium from the intermediate layer.

* * * * *